United States Patent
Petrescu-Prahova

(10) Patent No.: US 9,912,118 B2
(45) Date of Patent: Mar. 6, 2018

(54) DIODE LASER TYPE DEVICE

(76) Inventor: Iulian Basarab Petrescu-Prahova, North Brunswick, NJ (US)

( * ) Notice: Subject to any disclaimer, the term of this patent is extended or adjusted under 35 U.S.C. 154(b) by 0 days.

(21) Appl. No.: 12/803,476

(22) Filed: Jun. 28, 2010

(65) Prior Publication Data

US 2011/0317730 A1 Dec. 29, 2011

(51) Int. Cl.
H01S 5/20 (2006.01)
H01S 5/10 (2006.01)
H01S 5/028 (2006.01)
H01S 5/16 (2006.01)

(52) U.S. Cl.
CPC .......... *H01S 5/1032* (2013.01); *H01S 5/2018* (2013.01); *H01S 5/028* (2013.01); *H01S 5/1003* (2013.01); *H01S 5/16* (2013.01); *H01S 5/2031* (2013.01); *H01S 2301/18* (2013.01)

(58) Field of Classification Search
CPC .... H01S 5/1003; H01S 5/2018; H01S 5/2031; H01S 5/1032
USPC ...................................... 372/46.014
See application file for complete search history.

(56) References Cited

U.S. PATENT DOCUMENTS

| | | | |
|---|---|---|---|
| 4,378,255 A | 4/1983 | Holonyak | |
| 4,594,603 A | 6/1986 | Holonyak | |
| 5,063,173 A | 11/1991 | Gasser | |
| 5,345,460 A | 9/1994 | Takiguchi | |
| 5,444,730 A * | 8/1995 | Mizutani | 372/45.01 |
| 5,513,204 A | 4/1996 | Jayaraman | |
| 5,665,637 A | 9/1997 | Chand | |
| 5,818,860 A | 10/1998 | Garbuzov | |
| 6,005,881 A | 12/1999 | Ikoma | |
| 6,037,189 A | 3/2000 | Goto | |
| 6,080,598 A | 6/2000 | Kaway | |
| 6,272,161 B1 | 8/2001 | Petrescu-Prahova | |
| 6,522,677 B1 | 2/2003 | Petrescu-Prahova | |
| 6,618,409 B1 | 9/2003 | Hu | |
| 6,744,796 B1 | 6/2004 | Chakrabarty | |

(Continued)

FOREIGN PATENT DOCUMENTS

JP 2008034663 A 2/2008
RU 2153746 C2 7/2000

(Continued)

OTHER PUBLICATIONS

Mawst et al., "8 W continous front facet power from broad-waveguide Al-free 980 nm diode lasers" Appl. Phys. Lett., vol. 69, p. 1532, (1996).

(Continued)

*Primary Examiner* — Tod T Van Roy
(74) *Attorney, Agent, or Firm* — Graham Curtin, P.A.

(57) ABSTRACT

Semiconductor laser with mirror facet protection against degradation including a modified segment near the exit window that has a double waveguide with a reduced confinement factor compared with the confinement factor of the double waveguide of the main laser segment, such that the radiation at the exit facet in the modified double waveguide is pushed away from the active region, less radiation is absorbed at the facet and less heat is produced by nonradiative recombination at the exit facet, while the field distribution of the two double waveguides have a good overlap and low transfer losses due to the use of waveguide type structures with an active waveguide and a passive trapping waveguide.

5 Claims, 3 Drawing Sheets

(56) References Cited

U.S. PATENT DOCUMENTS

| | | | |
|---|---|---|---|
| 7,251,381 B2* | 7/2007 | Buda et al. | 385/11 |
| 7,338,821 B2 | 3/2008 | Ressel | |
| 7,442,628 B2 | 10/2008 | Yamane | |
| 7,687,291 B2 | 3/2010 | Charache | |
| 7,830,938 B2* | 11/2010 | Rossin | 372/45.01 |
| 2003/0086654 A1 | 5/2003 | Saini et al. | |
| 2004/0190575 A1 | 9/2004 | Ghislotti et al. | |
| 2007/0165685 A1* | 7/2007 | Mizuuchi et al. | 372/38.05 |
| 2008/0259982 A1 | 10/2008 | Kim et al. | |
| 2011/0317730 A1 | 12/2011 | Petrescu-Prahova | |

FOREIGN PATENT DOCUMENTS

| | | |
|---|---|---|
| SU | 1329533 A1 | 5/1988 |
| WO | 1996008062 A1 | 3/1996 |
| WO | 9857401 A1 | 12/1998 |
| WO | WO2009143813 A1 * | 12/2009 |

OTHER PUBLICATIONS

Petrescu_Prahova et al., "High Brightness 810 nm Long Cavity Diode Lasers with high d/gamma Ration in Asymmetric Low Confinement Epitaxial Structures", Laser and Electro-Optics Society 2001 Conference, LEOS 2001 the 14th Annual Meeting of the IEEE, p. 135, (2001).

Petrescu-Prahova et al., 253 mW/um maximum power density from 9xx nm epitaxial laser structures with d/gamma greater than 1 um, IEEE 21st International Semiconductor Laser Corference, 2008, ISLC 2008, p. 135 (2008).

Crump et al., "Limitations to peak continous wave power in high power broad area single emitter 980 nm diode lasers", Conference of Laser and Electro-optics and the European Quantum Electronics Conference, CLEO Europe and EQEC 2009 Digest (2009).

Blauvelt et al., "Large opticasl cavity AlGaAs buried heterostructure window laser", Appl. Phys. Lett., vol. 40, p. 1029 (1982).

Baoxue et. al., "A novel structure for high peak power semiconductor lasers" ICO 20 Laser and Laser Technologies Conferences, Proc. of SPIE vol. 6028, 60280U, (2005).

Search Report dated Apr. 25, 2012 in corresponding European Application No. 11009831.6.

Lee J J et al: "Asymmetric Broad Waveguide Diode Lasers (lambda= 980 nm) of Large Equivalent Transverse Spot Size and Low Temperature Sensitivity", IEEE Photonics Technology Letters, IEEE Service Center, Piscataway, NJ, US, vol. 14, No. 8, Aug. 1, 2002 (Aug. 1, 2002), XP011067237, ISSN: 1041-1135.

International Search Report with Written Opinion, dated Mar. 10, 2016, for corresponding international application PCT/US2015/034351.

USPTO Non-Final Office action dated Nov. 6, 2015, for corresponding U.S. Appl. No. 14/731,576.

Communication under Rule 71 (3) EPC according to which the Examining Division of the European Patent office intends to grant a patent for corresponding European Patent Application No. 11009831.6.

Xin, Gao, Qiao Zhongliang, Xu Liuyang, Yuan Xuze, Cao Xiwen, Xia Xiaoyu, and Bo Baoxue. "Development of high power diode lasers for high performance operation." In 2015 International Conference on Optoelectronics and Microelectronics (ICOM), pp. 65-68. IEEE, 2015.

Epperlein, Peter W. Semiconductor Laser Engineering, Reliability and Diagnostics: A Practical Approach to High Power and Single Mode Devices. John Wiley & Sons, 2013.

Thorlabs, Exhibit A, Reliability Study of LD808-SE500 (808nm, 500mW, Single Spatial Mode, To-9), Jan. 28, 2016.

Thorlabs, Exhibit B, Reliability of 785nm FP Laser (MESA waveguide), Jan. 4, 2017.

Thorlabs, Product Specification Sheet, 785 nm Grating Stabilized TO Can Laser Diode, 300 mW, LD785-SEV300, Sep. 27, 2016.

Thorlabs, Product Specification Sheet, 808 nm Grating Stabilized TO Can Laser Diode, 500 mW, LD808-5E500, Sep. 26, 2016.

* cited by examiner

DIODE LASER TYPE DEVICE

BACKGROUND OF THE INVENTION

Field of the Invention

The invention relates to semiconductor lasers, known also as diode lasers. The invention can be used to protect windows of laser chips against degradation. Protection is achieved by using end segments adjacent to windows. The chip epitaxial structures comprise a double waveguide, which comprises an active waveguide and a coupled passive trapping waveguide.

Background Art

Laser oscillators and laser amplifiers are most known semiconductor type laser devices, in short semiconductor laser devices. This application is related to edge emitter semiconductor lasers, wherein the amplification by stimulated emission (laser effect) is produced along a device which is millimeters long and the emission exits through facets, also known as windows, at the ends of the device. It is known that the active region projection on the exit facets is the part of semiconductor type laser devices which is most sensitive to degradation. This is the place where Catastrophic Optical Degradation (COD) and important gradual degradation processes occur. These degradation processes represent important factors that determine the limits for the operation of these lasers at high power and at high power density of the radiation that traverse the exit window. The catastrophic degradation is practically instantaneous when the power density of the radiation, emitted through the active region at the mirror facet, overpasses certain threshold values. The values for the power density of the emitted radiation that passes through the active region and produce catastrophic degradation are, in a great extent, material characteristics. In some cases, the gradual degradation starts from the mirror, having in the end, after a time period, the same effects as the catastrophic degradation, i.e. the irremediable destruction of the mirrors and of the laser. To avoid degradation, it is recommendable the laser operation at power and power density levels lower than the catastrophic degradation level.

There are known diode lasers whereat the surface of the diode laser window facet, defined as the interface between the semiconductor material of the type $A_3B_5$, $A_2B_6$, or other semiconductor materials and the external medium, most frequently the surrounding air, is covered with thin layers of other materials. There are such proposals for mirror covering with different types of oxides, including the natural oxides of the semiconductor materials of the laser structure. The disadvantage of the oxide covering is that usually they do not produce the highest catastrophic degradation power levels. There are proposals for mirror covering with other semiconductor materials, transparent to the laser emitted radiation, for example with ZnSe, usually polycrystalline. Although it produces a very high catastrophic degradation level, the disadvantage of this method is that, in order to have the highest efficiency and reliability, the deposition of other semiconductor materials need to be done in very clean conditions, for example by cleaving the mirrors in very high vacuum and by immediately covering the resulting facet in this high vacuum conditions.

There are also known diode lasers whereat the mirror facet is covered with semiconductor materials from the same family as the semiconductor materials that form the multilayer structure of the diode laser, for example a material of the type $Al_xGa_{1-x}As$ in the case of a structure obtained from layers in the $Al_xGa_{1-x}As$ system. In all cases the covering material has the energy gap higher than the energy gap of the active layer, in order to be transparent to the laser emitted radiation. To deposit this covering semiconductor material, in the semiconductor wafer that contains a laser layered structure, narrow etching streets are formed at the approximate location where the future mirror will be and the new covering material is deposited in place of the etched material. The disadvantage of this method is that in order to etch the active region and to replace it with other semiconductor material, the entire waveguide is affected and the waveguide is interrupted at the etch-regrowth interface, at a certain distance from the exit window surface. This is especially true for symmetric layered structures that contain the active region in the middle of the structure's single waveguide. From the etch-regrowth interface the radiation propagates toward the facet by diffraction. A wide etching street has the disadvantage that increases the diffraction losses and reduces the effective reflection coefficient. A narrow etching stripe, with a pronounced depth profile, has the disadvantage that is more difficult to be obtained in real life, the regrowth processes are more difficult and the further cleaving inside of a narrow stripe is more difficult.

There are known diode laser structures that comprise two waveguides where the active region is located asymmetrically relative to the whole structure, hi this case only one waveguide is etched and the full etch-regrowth process can reconstruct a waveguide with similar properties as the initial waveguide, but still have the disadvantage they are formed by a difficult process.

Both etch-regrowth solutions have the disadvantages that the etching dissolves the active region itself, possibly leaving, at the interface between the undissolved active region and the regrown material, defects that act as nonradiative recombination centers, and that the regrowth process is by itself cumbersome.

BRIEF SUMMARY OF THE INVENTION

The problem solved by this invention is the use of end segments with less absorbing windows that do not interrupt essentially the propagation properties of a semiconductor laser waveguide to the mirror facet, reduce the absorption losses and nonradiative recombination in a region close to the mirror facet and do not introduce supplementary defects when implemented.

The semiconductor laser devices according to the invention avoid the disadvantages of other known solutions since they comprise a first main segment having a layered structure with a double waveguide that has two waveguides, one comprising the active region and being situated closer to the top of the layered segment, and a second waveguide that captures part of the radiation emitted in the active region, the second waveguide named also the passive trapping waveguide, and a second end segment with a similar layered structure which is formed between the main segment and an exit mirror facet by modifying part of the top cladding layer but not touching the active region such that part of the radiation propagating in the modified segment is additionally shifted from the active region waveguide toward the trapping waveguide, avoiding absorption losses and nonradiative recombination in the active region close to the mirror facet.

By his modification a large part of the end segment layered structure remains unaffected, such that the optical properties of the initial main segment structure are preserved into a great extent, so that the radiation is propagating up to the mirror into a waveguide similar to the waveguide of the initial first main segment.

The semiconductor laser devices with less absorbing windows, according to the invention, have the following advantages: the layered structure suited for the partial removal of some layers, without an essential change of the waveguide, are low confinement structures which can operate at very high power densities and output powers; the removal process stops before the active region is reached, such that the active region is not exposed to the removal process that might induce defect formation that enhances nonradiative recombination; the radiation propagation in the end segment up to the cleaved mirror facet is done with minimum coupling losses relative to the rest of the initial, unmodified first segment; in the same process can be obtained both windows with proper optical properties and the ridges for the longitudinal propagation.

BRIEF DESCRIPTION OF THE DRAWINGS

In the following, examples for the embodiment of the invention will be given, in connection with FIGS. 1-5, that represent.

DETAILED DESCRIPTION OF THE INVENTION

Figure 1:
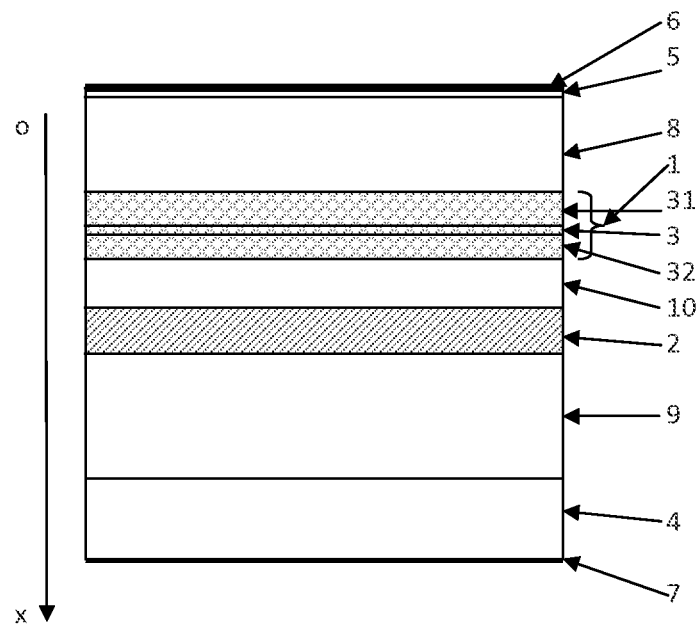
FIG. 1 A multilayer structure

Less absorbing windows for semiconductor laser devices according to the invention are obtained in an initial layered structure similar to that described in FIG. 1, formed from several layers. Among these layers some form a first, active waveguide 1, double hatched in FIG. 1 and a second waveguide, named the passive trapping waveguide, 2, single hatched in FIG. 1. The first waveguide includes at least an active layer 3. It might include on both sides of layer 3 two guiding layers 31 and 32. When more active layers are present they are separated by barriers for carriers and together form an active region. These two waveguides 1 and 2 form a double waveguide. The structure lays on a substrate 4 and ends with a top contact layer 5. The wording "top" is used in opposition with "substrate" which is generally accepted as being down. The radiation is produced mostly in the active region by the recombination of the pairs of opposite sign charge carriers, electrons and holes, which are injected by a p-n junction located in the active region vicinity or by a p-i-n structure that includes the active region.

The active waveguide 1 that includes the active region is situated asymmetrically relative to the whole structure, closer to the top contact layer 5. The top contact layer is followed by a corresponding metal contact 6. On the other side of the substrate, relative to the multilayer structure, is situated the other metal contact 7. Using these two metal contacts 6 and 7 an electrical bias U is applied to the structure, what produces the flow of an electrical current I.

The double waveguide comprises several other layers, also essential being two cladding layers that transversally confine the emitted radiation to the whole layered structure: a top cladding layer 8 and a substrate cladding layer 9. The two mentioned waveguides can be separated by a separation layer 10. In FIG. 1 is shown a structure, with a separation layer 10. Separation layer is not always necessary and the waveguides might be joined. With reference to an orthogonal system Oxyz, the layers of the multilayer structure are parallel with the plane yOz and the radiation propagates in the longitudinal direction Oz. The Ox direction, perpendicular to the plane yOz is the transversal direction. The refractive index along the transversal direction depends on coordinate x: $n=n(x)$. The refractive index does not depend on the lateral direction Oy. The refractive indexed are named corresponding to the layer to whom they are related. The layer identification will appear as a subscript. For example, if substrate cladding layer 9 has a constant refractive index, then its value is $n_9$ and, if the refractive index is variable, then the function describing its variation is $n_9(x)$.

Figure 2:
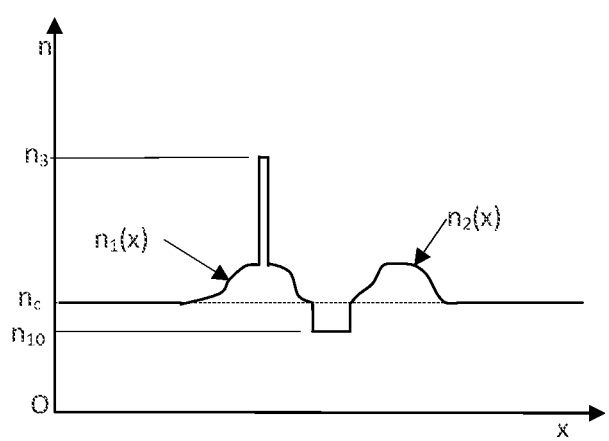
FIG. 2 A possible variation of the refractive index for a first embodiment

A first embodiment for the initial layered structure is shown in FIG. 2. The refractive indexes of cladding layers have constant values $n_c$, the same for both layers: $n_8=n_9=n_c$. The refractive indexes in the mentioned waveguides 1 and 2 are higher than the refractive indexes of the cladding layers 8 and 9. In general the waveguide's refractive indexes are variable, described by functions $n_1(x)$ and $n_2(x)$. The profile of the function $n_1(x)$ and $n_2(x)$ are bumps over the $n_c$ line, which traverses the bottom of these bumps as a dashed line. The first waveguide 1 which comprises at least an active layer has at the active layers location high refractive indexes. The separation layer index $n_{10}$ might have values under or above this line. In the case $n_{10}$ is lower, it acts as a less transparent radiation barrier between the two waveguides. On the contrary, when it is higher, it acts as a more transparent radiation barrier between the two waveguides. Bump magnitudes can characterize the waveguides.

The bump magnitudes, either that of the first waveguide 1, formed between the separation layer 10 and the top cladding layer 8, or that of the second waveguide 2, formed between the substrate cladding layer 9 and the separation layer 10, are defined as being equal to the sums of elementary regions thickness in these bumps $\delta x$, and multiplied with the square root of the difference between the square of the refractive index of each elementary region and the square of the refractive index $n_{9max}$: $\Sigma \delta x(n(x)^2-n_9^2)$. The sum of bump magnitudes needs to be relatively small for the structure with several layers to accept only the transversal fundamental mode, with the same phase in both waveguides. When the refractive index of the separation layer 10 is higher than $n_c$, its magnitude should be included in the evaluation of the sum of bump magnitudes.

Figure 3:
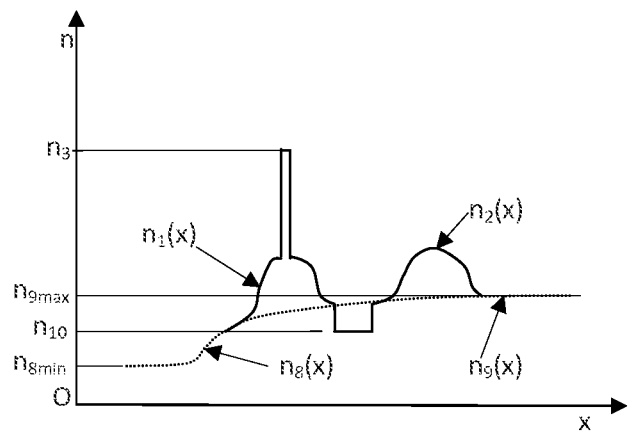
FIG. 3 A possible variation of the refractive index for a second embodiment

A second, more general embodiment than for the initial layered structure is described in FIG. 3. Refractive indexes in the cladding layers 8 and 9 are function on position x. FIG. 3 shows a possible variation of the refractive index into a structure with separation layer. $n_9(x)$ is the variable refractive index of the substrate cladding layer 9, $n_{9max}$ is the maximum value of the refractive index of the substrate cladding layer 9, etc. If a layer is described by a single value of its refractive index, only this value is mentioned, like $n_3$ or $n_{10}$.

To act as waveguides, the refractive indexes in the mentioned waveguides 1 and 2 should be higher than the refractive indexes of the cladding layers 8 and 9. If the refractive indexes of the cladding layers 8 and 9 are function on position x, it is preferred to have an increase of the refractive index of the cladding layers 8 and 9, from the extremity near top contact layer of the top cladding layer 8 toward the extremity near substrate of the substrate cladding layer 9 and the highest refractive index of the top cladding layer 8, $n_{8max}$, to be smaller or equal to the smallest refractive index of the substrate cladding layer 9, $n_{9min}$. With a dotted line is described the mentioned increasing general tendency, that is excluding the first and the second waveguides bumps and a possible variation in the separation layer. In the transversal direction, the field distribution is trapped in the two mentioned waveguides 1 and 2 by the bumps formed by their refractive index profiles, relatively higher than the refractive indexes of adjacent layers. The ascending profile of function $n_8(x)$ and $n_9(x)$ also repels the field distribution from the cladding layer 8 and from the first waveguide 1 toward the second passive trapping waveguide 2. This effect will be named in short the optical wall effect. By using the optical wall effect, narrower top cladding layer 8 could be used to contain the radiation in the whole layered structure.

The described structure, by a proper selection of the optical and geometrical properties of the constitutive layers, is characterized by the fact that much of the radiation field distribution is attracted toward second waveguide and pushed from the first waveguide 1, where the radiation is produced. The allocation of the field between these two attractors depends on the relative magnitudes of the waveguide bumps measured from the highest refractive index $n_{9max}$ of the substrate cladding layer 9, and on the optical wall effect that might be induced by the cladding layer 8. In comparison with the first embodiment, the position of the first waveguide and of active region closer to the top of the structure facilitates changes in field allocation by technological processes.

In the case of the second embodiment, the bump magnitudes, either that of the second waveguide 2, formed between the substrate cladding layer 9 and the separation layer 10, or that of the first waveguide 1, formed between the separation layer 10 and the cladding layer 8, are defined as being equal to the sums of elementary regions thickness in these bumps $\delta x$, and multiplied with the square root of the difference between the square of the refractive index of each elementary region and the square of the refractive index $n_{9max}$: $\Sigma \delta x(n^2 - n_{9max}^2)$. The sum of the bump magnitudes need to be relative small for the structure with several layers to accept only the transversal fundamental mode, with the same phase in both waveguides.

Figure 4:
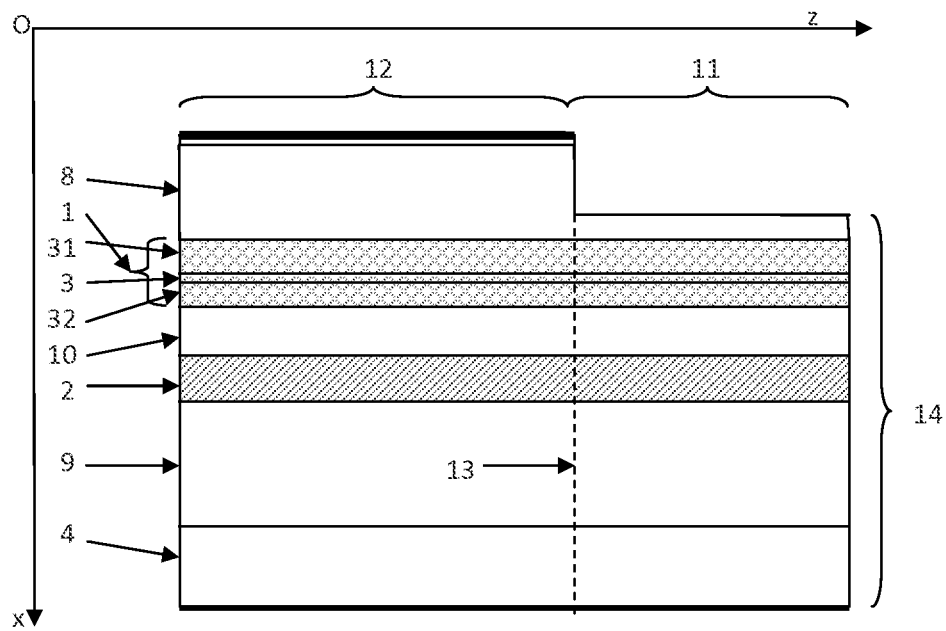
FIG. 4 A longitudinal arrangement comprising an initial main segment with a layered structure and an end segment with a modified layered structure, which acts as a less absorbing mirror FIG. 5 Normalized intensity field distributions in transversal direction for the initial main segment and for the modified end segment structures of a particular design
Figure 5:
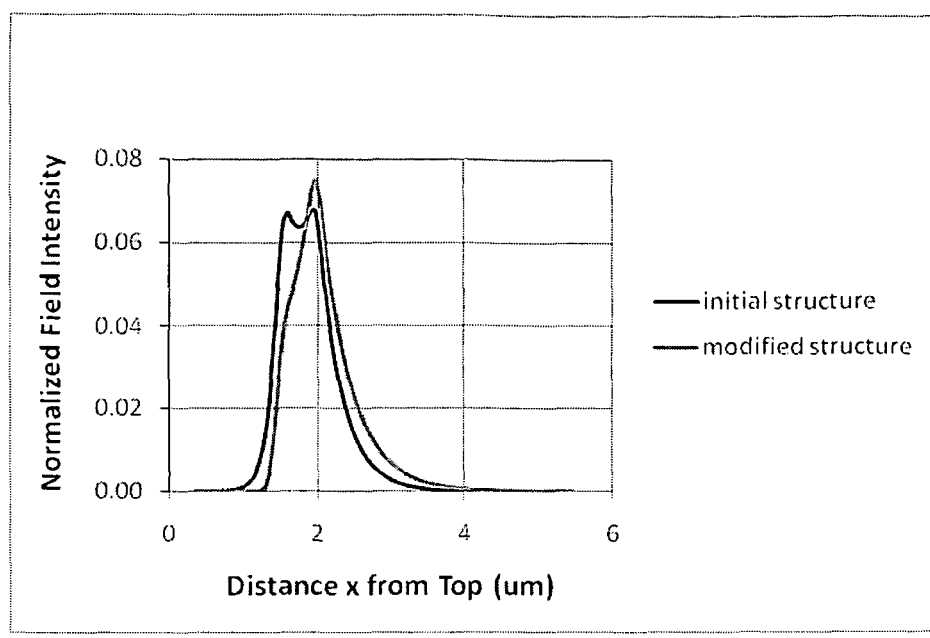

A less absorbing window segment 11 is obtained by modifying the initial structure, in a street perpendicular to the propagation direction Oz as shown in FIG. 4. By this modification, part of the cladding layer 8 is removed but the two waveguides 1 and 2, and especially the active region, are preserved intact.

As a consequence of these processes, along the propagation direction Oz in the semiconductor laser there are two waveguide structures, an initial structure in a first segment 12 and the modified structure in an end segment 11. These two segments are separated from each other by a separation interface 13, shown with a dashed line. The end segment with a modified structure is separated from the external medium by an exit facet 14.

For the initial structures with planar layers of the first segment 12, that are not delimited or modified in the lateral direction Oy, the modes that propagate along the propagation direction Oz are characterized by a radiation field distribution in the transversal direction Ox, a distribution described by a function $E(x)$. In the direction Oy the $E(x)$ function is assumed constant. The mode propagating in the modified structure of the end segment 11 has a radiation field distribution function $E'(x)$. The functions $E(x)$ and $E'(x)$ are normalized scalar functions intended to describe the distributions of the vector electromagnetic fields E, H. They are solutions to the corresponding Helmholtz equations in the refractive indexes profiles of these structures. The effective refractive indexes for modes propagating in the two structures 12 and 11 and noted $n_{eff}$ and $n'_{eff}$ are part of the same solutions.

Generally, the field distributions have maxima at the location of the two waveguides. When one of the maxima is much higher than the other one, the second maximum appears only as a shoulder to the first maximum. The relative magnitude of these maxima depends on the magnitude of the respective waveguides but also on the external condition in cladding layers. The field distribution $E(x)$ exponentially decays inside the thickness of the cladding layer 8. Due to the fact that removing part of the cladding layer 8, a second wall is approaching the first waveguide 1, the optical field trapped in this first waveguide will be pushed toward the second waveguide. Compared with the field distribution $E(x)$ in the initial structure, the field distribution $E'(x)$ in the modified structure 11 has an increased maximum located at second waveguide and a decreased maximum located at the first waveguide. This second optical wall effect is induced by reflection on top interface 15 with the external medium: air, dielectrics, and metals, depending on adopted technology.

Due to the change in the relative magnitude of the two maxima, the modified segment 11 has a lower confinement factor $\Gamma'$ than the confinement factor $\Gamma$ of the initial segment 12. From the total flux $\phi$, only a fraction $\Gamma\phi$, respectively $\Gamma'\phi$ is passing through the active region. The consequence is that, as radiation travels in the modified segment toward the exit, a smaller flux, $\Gamma'\phi$, compared with $\Gamma\phi$, will have a chance to be absorbed near the exit facet 14 when exiting through the active region. It is known that Catastrophic Optical Degradation (COD) is mainly produced by the absorption of the radiation that exit through the active region followed by nonradiative recombination of the generated carriers. For structures with higher confinement factor the level of Catastrophic Optical Degradation is higher and the rate of gradual degradation due to changes in mirror structure is also higher. The less absorbing segment 11 having a structure with lower confinement factor protects the initial segment 12. On the other hand, the initial structure of the first segment 12 needs a higher confinement factor to assure enough modal gain for the laser effect.

This type of modified window segment 11 can be named Less Absorbing Mirror (LAM), in contrast with other types of windows which are Non Absorbing Mirrors (NAM).

The asymmetrical layered structures according with the invention are characterized by the fact that these two distribution functions are very similar to each other. The changes in the field distributions from E(x) to E'(x) are localized mainly at the position of the first waveguide 1. A measure of the similarity degree for the distribution functions is the overlapping coefficient or overlapping integral defined as $|\int E(x)E'(x)dx|^2$, where it was considered that the distribution functions E(x) and E'(x) are normalized to unity. An overlapping coefficient close to unity assures reduced losses for the propagating modes when passing through the separation surface 14, so that the radiation propagating in the fundamental mode of the initial layered structure of the first segment continues to propagate almost entirely in the fundamental mode of the modified layered structure of the end segment. A second consequence of this similarity is that the effective refractive indexes have close values.

In table 1 a structure with a separation layer, obtained from materials in the $Al_xGa_{1-x}As$ system for 940 nm emission is presented. The structure is defined by the layer's compositions and thicknesses. In this structure active region waveguide is formed by the active Quantum Well (QW) and two other layers on the-top and the bottom of the QW, which in this particular case have constant refractive indexes. The second waveguide, the trapping waveguide, has also a constant refractive index. Other more sophisticate profiles of the refractive indexes in the waveguides are possible.

TABLE 1

Layer's compositions and thicknesses for a structure with two waveguides

| Layer name | Top contact | Top contact clad. | QW in guiding, top $1^{st}$ wave-guide, | wave- guide active | guiding, bottom | Separa- tion | $2^{nd}$ trapping wave- guide $2^{nd}$ trapping wave- guide | Substr. clad. | Substr. |
|---|---|---|---|---|---|---|---|---|---|
| Layer ID | 5 | 8 | 1 | | | 10 | 2 | 9 | 4 |
| Comp. index x | 0.0 | 0.41 | 0.22 | InGaAs | 0.22 | 0.32 | 0.22 | 0.32 | 0.0 |
| Thickness(μm) | 0.2 | 1.2 | 0.137 | 0.007 | 0.072 | 0.3 | 0.22 | 3.4 | 100 |

In Table 2 a modified structure is presented. The difference between structure presented in Table 1 and structure presented in Table 2 is a thinner top cladding layer 6, which is covered with an oxide layer, and the missing top contact layer.

TABLE 2

Layer's compositions and thicknesses for a modified structure formed from an initial structure with two waveguides

| Layer name | Oxide | Top contact clad. | QW in guiding, top $1^{st}$ wave-guide, | wave- guide active | guiding, bottom | Separa- tion | $2^{nd}$ trapping wave- guide $2^{nd}$ trapping wave- guide | Substr. clad. | Substr. |
|---|---|---|---|---|---|---|---|---|---|
| Layer ID | | 8 | 1 | | | 10 | 2 | 9 | 4 |
| Comp. index x | | 0.41 | 0.22 | InGaAs | 0.22 | 0.32 | 0.22 | 0.32 | 0.0 |
| Thickness(μm) | 0.2 | 0.1 | 0.137 | 0.007 | 0.072 | 0.3 | 0.22 | 3.4 | 100 |

The normalized field intensity distributions in these two structures are presented in FIG. 4. The shift of the power distribution toward the second optical trap can be easily seen. The overlapping coefficient is 93%. The effective refractive indexes are n=3.3566 and n'=3.3531, respectively. The variation is $\delta n=3.5\times10^{-3}$, a value small enough to avoid strong reflections from the interface 13.

The confinement factor for the initial structure is Γ=0.72% and for the modified structure is Γ'=0.42%. The resistance to COD of the radiation propagating in the initial structure and in the modified LAM structure is increased by a factor of Γ/Γ'=1.67.

It is worthwhile to compare these results with the results from other layered, initial and modified structures, deriving from the first structures presented in Tables 1 and 2, but having only the active waveguide, without the second radiation trapping waveguide and with substrate cladding layer enlarged enough to avoid strong absorption in the substrate. These structures are presented in tables 3 and 4.

TABLE 3

Layer's compositions and thicknesses for a structure with only active waveguide

| Layer name | Top contact | Top contact clad. | guiding, top $1^{st}$ wave-guide, | QW in wave-guide active | guiding, bottom | Separation | $2^{nd}$ wave-guide | Substr. clad. | Substr. |
|---|---|---|---|---|---|---|---|---|---|
| Layer ID | 5 | 8 | | 1 | | | | 9 | 4 |
| Comp. index x | 0.0 | 0.41 | 0.22 | InGaAs | 0.22 | | | 0.32 | 0.0 |
| Thickness(μm) | 0.2 | 1.2 | 0.137 | 0.007 | 0.072 | | | 3.4 | 100 |

TABLE 4

Layer's compositions and thicknesses for a modified structure formed from an initial structure with only active region waveguide

| Layer name | Oxide | Top contact clad. | guiding, top $1^{st}$ wave-guide, | QW in wave-guide active | guiding, bottom | Separation | $2^{nd}$ wave-guide | Substr. clad. | Substr. |
|---|---|---|---|---|---|---|---|---|---|
| Layer ID | | 8 | | 1 | | | | 9 | 4 |
| Comp. index x | | 0.41 | 0.22 | InGaAs | 0.22 | | | 0.32 | 0.0 |
| Thickness(μm) | 0.2 | 1.2 | 0.137 | 0.007 | 0.072 | | | 3.4 | 100 |

The initial structure having only the active waveguide has a confinement factor Γ=0.81%. The modified structure obtained from the structure with only the active region waveguide has a confinement factor Γ'=0.49%. The resistance to COD of the radiation propagating in the initial structure and in the modified LAM structure is increased by a factor of Γ/Γ'=1.65. The effective refractive indexes are n=3.3505 and n'=3.3490, respectively, and $\delta n=1.5\times10^{-3}$. The overlapping coefficient is 89%. A first disadvantage of structures with only the active waveguide is that the overlapping coefficient is lower, such that the scattering losses offset more what is obtained in COD power level. A second disadvantage is that the substrate cladding layer needs to be very large in order to avoid radiation trapping in substrate and the subsequent losses.

The mirror protection with LAM segments is useful also for the back mirror. In fact the front and back streets can be obtained in a single process and separated later at the mirror facet formation.

If the top cladding layer removal is done also laterally, a ridge structure is formed. A lateral effective refractive index change is associated with ridge formation. As mentioned, the effective refractive index in initial structure in Table 1, n=3.3566, drops to n'=3.3531 in the modified structure of Table 2 and the variation is $\delta n=3.5\times10^{-3}$. A lateral guiding with this value for δn accepts modes with far field FWHM, $FF_{FWHM}$=17 degrees. This is a good value is some cases. In the case of single mode devices operating with high modal gain, a smaller variation δn might be necessary. To cope with this situation, removal of the top cladding layers down to two depths is needed.

The LAM window segments protect the exit facets from the high power density of laser devices. It can work for laser oscillators, but also for Semiconductor Laser Amplifiers (SOA). In this later case the LAM street and the interface 13 should by laterally parallel to the facet 13. The back reflection in the case stripes inclined relative to interface 14 is reduced to very small values by this inclination, but also by small values of δn.

What is claimed is:

1. An edge emitter semiconductor type laser device comprising longitudinally, in order:
   an exit mirror;
   an end segment;
   a main segment; and
   a rear mirror;
   the edge emitter semiconductor type laser device further comprising transversally, for each segment on a substrate, a layered structure with selected optical properties that comprises, in order:
   a substrate cladding layer;
   a double waveguide; and
   a top cladding layer;
   the double waveguide comprises:
   a passive waveguide, adjacent to the substrate cladding layer; and
   an active waveguide including at least an active region, adjacent to the top cladding layer;
   the top cladding layer of the layered structure of the end segment is thinner than the top cladding layer of the layered structure of the main segment;

in the main segment only radiation in the fundamental transversal mode is obtained by a laser effect from an action of electrical means on the active region of the active waveguide of the main segment;

the fundamental transversal mode of the main segment couples with the fundamental transversal mode of the end segment, the amount of coupling being determined by an overlapping coefficient;

wherein the separation of the end segment from the main segment evolves by removing material from a straight line on the main segment top face;

wherein the value of the overlapping coefficient between the fundamental transversal mode propagating in the main segment and the fundamental transversal mode propagating in the end segment is equal or higher than about 90% and the confinement factor for the fundamental transversal mode of the active region of the active waveguide of the end segment is reduced to as low as 60% of that of the main segment; and these combined functions inhibit the phenomena of catastrophic optical degradation produced by the radiation passing through the active region at the front facet, while preserving the emission in the fundamental transversal mode by reducing coupling losses from this mode.

2. The edge emitter semiconductor type laser device according to claim 1, further comprising laterally two lateral sections that surround the main segment, wherein the lateral sections have the layered structure of the end segment.

3. The edge emitter semiconductor type laser device according to claim 1, further comprising a separation layer between the passive and active waveguides.

4. An edge emitter semiconductor type laser device comprising longitudinally, in order:
an exit mirror;
an end segment;
a main segment; and
a rear mirror;
the edge emitter semiconductor type laser device further comprising transversally, for each segment on a substrate, a layered structure with selected optical properties that comprises, in order:
a substrate cladding layer;
an active waveguide including at least an active region; and
a top cladding layer;
the top cladding layer of the layered structure of the end segment is thinner than the top cladding layer of the layered structure of the main segment;

in the main segment only radiation in the fundamental transversal mode is obtained by a laser effect from an action of electrical means on the active region of the active waveguide of the main segment;

the fundamental transversal mode of the main segment couples with the fundamental transversal mode of the end segment, the amount of coupling being determined by an overlapping coefficient;

wherein the separation of the end segment from the main segment evolves by removing material from a straight line on the main segment top face;

wherein the value of the overlapping coefficient between the fundamental mode propagating in the main segment and the fundamental transversal mode propagating in the end segment is equal or higher than about 90% and the confinement factor for the fundamental transversal mode of the active region of the active waveguide of the end segment is reduced to as low as 60% of that of the main segment; and these combined functions inhibit the phenomena of catastrophic optical degradation produced by the radiation passing through the active region at the front facet, while preserving the emission in the fundamental transversal mode by reducing coupling losses from this mode.

5. The edge emitter semiconductor type laser device according to claim 4, further comprising laterally two lateral sections that surround the main segment, wherein the lateral sections have the layered structure of the end segment.

* * * * *